(12) United States Patent
Goodrich et al.

(10) Patent No.: US 7,150,923 B2
(45) Date of Patent: *Dec. 19, 2006

(54) CHROME COATING COMPOSITION

(75) Inventors: Gary D. Goodrich, Antioch, CA (US); Patrick J. Colahan, Antioch, CA (US)

(73) Assignee: Goodrich Technology Corporation, Pittsburg, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/990,708

(22) Filed: Nov. 17, 2004

(65) Prior Publication Data

US 2005/0067273 A1    Mar. 31, 2005

Related U.S. Application Data

(60) Continuation-in-part of application No. 10/137,847, filed on May 2, 2002, now abandoned, which is a division of application No. 09/695,509, filed on Oct. 24, 2000, now Pat. No. 6,399,152.

(51) Int. Cl.
*B32B 15/082* (2006.01)
*B32B 15/092* (2006.01)

(52) U.S. Cl. .................. 428/636; 428/416; 428/457

(58) Field of Classification Search .............. None
See application file for complete search history.

(56) References Cited

U.S. PATENT DOCUMENTS

| | | | | |
|---|---|---|---|---|
| 2,859,158 A | * | 11/1958 | Schaer | 205/180 |
| 2,898,234 A | * | 8/1959 | Nack et al. | 427/229 |
| 2,956,888 A | * | 10/1960 | Gunning | 106/10 |
| 3,603,837 A | * | 9/1971 | Turner | 315/52 |
| 4,180,448 A | * | 12/1979 | Soshiki et al. | 430/216 |
| 4,382,976 A | * | 5/1983 | Restall | 427/456 |
| 4,407,871 A | * | 10/1983 | Eisfeller | 428/31 |
| 4,480,261 A | * | 10/1984 | Hattori et al. | 257/753 |
| 5,468,518 A | * | 11/1995 | Lein et al. | 427/160 |
| 5,656,335 A | * | 8/1997 | Schwing et al. | 427/447 |
| 5,773,154 A | * | 6/1998 | Takada | 428/458 |
| 5,837,354 A | * | 11/1998 | Ogisu et al. | 428/208 |
| 5,879,532 A | * | 3/1999 | Foster et al. | 205/192 |
| 6,068,890 A | * | 5/2000 | Kaumle et al. | 427/534 |
| 6,156,379 A | * | 12/2000 | Terada et al. | 427/214 |
| 6,399,152 B1 | * | 6/2002 | Goodrich | 427/250 |
| 2002/0170460 A1 | * | 11/2002 | Goodrich | 106/1.12 |

FOREIGN PATENT DOCUMENTS

| | | | |
|---|---|---|---|
| GB | 1115911 | * | 6/1968 |
| JP | 10-162338 | * | 6/1998 |
| JP | 11-034190 | * | 2/1999 |

* cited by examiner

*Primary Examiner*—John J. Zimmerman
(74) *Attorney, Agent, or Firm*—Anthony G. Eggink; Katrina M. Eggink

(57) ABSTRACT

A metallic coating composition and vacuum metalization process for applying the coating composition on various substrates, for example vehicle wheels, hub caps, bumpers and the like. The process is environmentally compatible and produces a decorative, wear-resistant chrome finish and comprises four stages: a cleaning or preparation stage, a base coat application stage, a two-step PVD stage, and a topcoat application stage. An organic epoxy, thermosetting powder base coat is applied to smooth the surface to a glass-like finish and to ensure adhesion of the metal coatings. A two part metal coating is then applied via a PVD process, consisting of a Ni/Cr base and a Cr layer. A protective acrylic, thermosetting topcoat is then applied to protect the metal coating layers.

16 Claims, 1 Drawing Sheet

CHROME COATING COMPOSITION

This application is a Continuation in Part of Applicant's application having Ser. No. 10/137,847, filed May 2, 2002 entitled Chrome Coating Composition, now abandoned, which is a Division of Applicant's patent application having Ser. No. 09/695,509, filed Oct. 24, 2000 and which is now U.S. Pat. No. 6,399,152 B1, issued Jun. 4, 2002 and titled Vacuum Metalization Process For Chroming Substrates and which applications and patent are incorporated by reference herein.

BACKGROUND OF THE INVENTION

This invention relates generally to coating composition and a process for providing a chrome finish onto substrates. Particularly, the invention relates to a metallic coating composition and a process for vacuum metalizing chromium onto various substrates. Specifically, this invention relates to a two step vacuum metalization process for chroming aluminum, steel, plastic and other substrates for automotive parts, for example, for providing a chrome layer on automotive parts such as vehicle wheels, hub caps, bumpers, interior and exterior trim, knobs, handles and other parts.

The metalization process of the present invention has specific and sequential steps to produce chromed automotive and other parts having superior chrome adhesion characteristics to prevent delamination and having chemical and road hazard resistant qualities. Although the disclosure herein discusses the process of metalizing chromium in the production of vehicle wheels, other chroming processes as well as the chroming of other metallic and nonmetallic substrates are within the purview of this invention.

In the past, aluminum and steel vehicle wheels, for example, have traditionally been electroplated to produce chrome wheels. These prior art processes require the wheel rim to be polished to provide a very smooth surface for the chrome plating to be effective. Further, the wheels are pretreated in hazardous chemicals to provide a clean and homogeneous surface for adherence of the chrome plating. The wheels are then coated with up to three different metal coatings with each step requiring the wheel to be submerged in hazardous solutions. The failure rate of these prior art processes is generally high. Additionally, should the chrome plated surface be damaged, corrosion or rust will typically begin rapidly, causing the chrome plating to delaminate from the wheel surface.

Another alternative prior art process has been developed which applies the chrome coating by vacuum metalization, thereby eliminating the application of the decorative coating using hazardous solutions. This prior art process entails applying one or two primer coat compositions to provide a smooth surface and to provide a suitable adhesion for the Cr to be applied. The wheel is then placed into a vacuum metalization chamber where a decorative coating is applied. Subsequently, a coating is applied to protect the metalized layer from environmental elements. The process produces chrome-like finishes on wheels, but not equal to the quality of the plating process and as such has not been accepted by the wheel manufacturers in the United States.

The present invention overcomes the difficulties and the shortcomings of the prior art. An object of the present invention is to provide a true chrome finish on wheels and other parts that are resistant to harsh climatic conditions. A further objective is to eliminate hazardous materials used during the application process and to greatly reduce the potential for delamination should the coating be damaged, impacted or scratched, as has been problematic in the prior art. This process is also applicable to any substrate where a durable, decorative, chrome finish is desired on automotive parts, for example, on vehicle wheels, bumpers, hub caps, and the like. Particularly, the object of the invention is to provide a vacuum metalization process for chroming metal and other substrates, such as aluminum and steel substrates, for example.

SUMMARY OF THE INVENTION

The present invention relates to a metallic coating composition and a process for chroming metallic and nonmetallic substrates. The process of the invention utilizes a vacuum metalizing process which, preferably, comprises four stages: a cleaning or preparation stage utilizing a number of steps, a base coat application stage, a two-step Physical Vapor Deposition (PVD) stage, and a top coat application stage. Each stage utilizes specific process steps and uses particular formulations under specific process step parameters.

An aluminum or steel substrate or other object, for example a vehicle wheel, to receive a decorative chrome coating is first cleaned in the preparation stage to eliminate contamination. The base coat applied in the base coat application stage may be a thermosetting powder, a 2K cured-type liquid, a UV cured-type liquid, any combination thereof or the like that provides a smooth glass like finish surface for Nickel/Chromium adhesion. The cleaning stage begins by smoothing the wheel to provide a uniform surface roughness, however, mechanical alteration of the substrate may be minimized or omitted with the use of a compatible filler-type primer applied prior to the base coat. Next, a series of washes are performed to the wheel; if the wheel is aluminum in composition, an alkaline/deionized water solution wash, followed by a deionized (DI) water rinse, followed by a non-Chromate/DI water solution coating, and finished with another DI water rinse. If the wheel is of a steel composition, the non-Chromate/DI water solution coating is replaced by an Iron Phosphate/city water solution conversion coating followed by a city water rinse. In the cleaning step for either the aluminum or steel composition, the wheel is rinsed with a final DI water rinse. The wheel is then dried using high-pressure filtered air and is subsequently placed in an oven to be preheated to coating temperature and outgassed.

If the profile of the substrate is too excessive for the base coat to level the surface of the substrate and mechanical leveling and polishing is not desirable, a filler-type primer may be used. The selected primer must be compatible with the substrate and base coat.

The base coat applied in the base coat application stage may be a thermosetting powder or the like and provides a smooth surface for Nickel/Chromium adhesion, however, other compounds may be utilized. Alternatively, the base coat may be comprised of an electroplated coating, an e-coating, a 2K cured-type liquid, a UV cured-type liquid, or any combination thereof. The wheel and base coat are heated to permit the coating to melt and flow evenly across the surfaces of the wheel. The temperature is then increased so that the thermosetting organic powder, for example, will crosslink and solidify. The wheel temperature is then reduced in preparation for the two-step PVD stage.

To begin the two-step PVD stage, the wheel is placed into a PVD chamber. After the chamber pressure has been reduced and prior to application of the metallic coating onto the base coat the surface is preferably plasma cleaned. The plasma cleaning or etching of the surface removes any micro-size contamination from the surface and etches the surface to enhance adhesion mechanically and chemically as a result of the plasma cleaning gas(es). Plasma cleaning can be done by glow discharge, ion etching, or via other known art that produces the same mechanical and chemical effects on the surface of the substrate.

The PVD metal deposition stage consists of two steps. Both steps take place under vacuum conditions by a sputtering or similar process, for example. The first step comprises sputtering a layer of metal of approximately 80 wt % Nickel (Ni) and 20 wt % Chromium (Cr) base metal layer onto the base coat on the wheel. The second step comprises sputtering a layer of metal of approximately 99.9% purity (i.e., by wt) or better Chromium layer onto the metal base layer. All alloy percentages referred to in this application are weight percentages as known and inherent in the metallic and metal alloy arts. As further known, weight percent and atomic percent are generally similar in the applications for purposes of this invention. For example, a two component alloy system of 80 wt % Ni and 20 wt % Cr, when converted to atomic percent, is 78 atom % Ni and 22 atom % Cr. As further known in the art, various PVD and CVD processes are known utilizing metallic targets in vacuum conditions. Any such known processes may be utilized to deposit the Nickel/Chromium and Chromium layers according to the teachings of the invention and to thereby provide chrome coating compositions of the invention.

The protective top coat applied in the topcoat application stage is preferably a clear, organic, thermosetting powder, although other materials may also be utilized. Alternatively, the top coat may be comprised of an electroplated coating, e-coating, a 2K cured type liquid, a UV cured type liquid, or other such protective coating that provides the type of protection which matches the environment to which the substrate will be exposed. The top coat is applied to the wheel to cover the Chromium layer and is subsequently heated to cause crosslinking and solidification of the thermal-setting powder. The wheel is then permitted to cool down.

The vacuum metalization process of the present invention permits a decorative, chrome coating to be applied to a metal or other object, for example an aluminum or steel wheel, in an environmentally compatible manner without the use of hazardous chemicals and the resultant coating of which is resistant to harsh climatic conditions and delamination. These and other benefits of this invention will become clear from the following description by reference to the drawings.

DESCRIPTION OF THE PREFERRED EMBODIMENTS

The present invention relates to a coating composition and a process of applying a decorative chrome finish onto a substrate, and particularly to the vacuum metalization of chromium onto aluminum, steel or other substrates. The process of this invention provides a decorative and durable chrome finish for aluminum or steel objects, for example vehicle wheels, hub caps, bumpers, or the like and which is conducted in an environmentally compatible manner.

Although it is within the purview of this invention to provide a vacuum metalization process for chroming aluminum and steel substrates to produce articles exhibiting strong adhesion qualities of the metalized chrome and useful for a variety of articles and substrates, the chroming of an aluminum or steel wheel for automotive use will be used herein to describe the process stages and steps of the invention.

Figure 1:
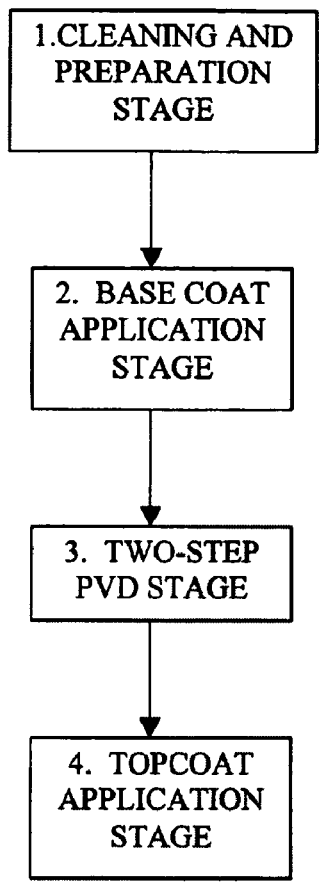
FIG. 1 is a flow diagram showing the steps of the process of the present invention.

Referring to FIG. 1, the four steps comprising the process of the present invention are set forth. The four general steps of the process are as follows: 1) Cleaning or Preparation Stage, 2) Base Coat Application Stage, 3) Two-Step PVD Stage and 4) Top Coat Application Stage.

Cleaning and Preparation Stage

The Cleaning and Preparation Stage 1 as shown in the process flow diagram of FIG. 1 is comprised of various process steps. The surface of the substrate is initially smoothed to a roughness not greater than approximately 1.5 mils by any industry accepted process. In other words, the smoothness of the substrate surface preferably does not exceed approximately 1.5 mils, measuring from the valleys to the peaks on the substrate surface. The substrate, for example a wheel, is then placed into a high-pressure blast cabinet, where the surface is roughed evenly with a polishing type blast media with coarseness not greater than approximately a 120 grit. This process step provides a substrate surface that is congenial for the adhesion of the base coat application.

The substrate or wheel is next put through a multi-step, spray washer type, pretreatment process, depending on whether the substrate is aluminum or steel, to ensure that all contamination has been removed from the substrate and to provide proper adhesion of the base coat. During the pretreatment process the wheel is held in the vertical position to ensure complete coverage and to prevent puddling in any recessed areas. The first step of the pretreatment is an approximately 60 second wash cycle of an approximately 3% to 6% solution, Alkaline and deionized water, is applied at a temperature of approximately 140° F. This cleaning step is to remove any contamination that may be present on the substrate surface. The next step is an approximately 30-second cycle of deionized water rinse, applied at ambient temperature. If the wheel is constructed of aluminum, the next step is an approximately 60 second cycle of an approximately 1% to 3% solution, non-Chromate conversion and deionized water coating, is applied at approximately 140° F., to insure proper adhesion of the base coat. If the wheel is constructed of steel, the next step is an approximately 180-second wash cycle of an approximately 3%–7% solution, Iron Phosphate and city water conversion coating, applied at approximately 140° F., to insure proper adhesion of the base coat, followed by a city water approximately 60-second rinse step, applied at ambient temperature. The next step is an approximately 30 second cycle of deionized water rinse, applied at ambient temperature and the following step is a final approximately 30-second, separate deionized water rinse. The deionized water used in the rinse/wash steps preferably has a mineral content no greater than approximately 25 ppm to ensure that no contamination is present in any of the solutions or rinses. Pretreatment lines vary in the number of steps and the types of processes being performed. Generally, as long as the pretreatment process provides a clean surface with good adhesion properties the process is acceptable for purposes of this invention.

Excess water is next blown off by filtered air before entering a dry-off oven. The wheel is heated in the dry-off oven to a temperature of approximately 275° F. to 350° F. The latter step serves two purposes: it evaporates any moisture on the wheel left from the pretreatment process and it causes the pores in the aluminum or steel to outgas any contamination and/or trapped vapors. This step insures that the contamination and/or trapped vapors will not release during the heating steps required in the base and top coat application stages. The wheel then enters a cool down chamber where filtered air cools the wheels to an approximate temperature range of approximately 150° F. to 290° F., in preparation for the base coat application.

The wheel preferably exits the cool down chamber directly into a pressurized clean room, wherein the atmosphere consists of particulates not greater than approximately 100,000 ppm. Personnel working within the clean room should preferably be required to wear a clean room type suit and dust mask to prevent introduction of additional airborne contamination from their clothes, body hair, and the like. The remaining steps are also carried out in this clean room environment and under these conditions to protect from airborne contamination. The cleaning and preparation stage steps set forth above are exemplary to provide a proper metal surface for the remaining stages of the process of the invention.

Base Coat Application Stage

The Base Coat Application Stage 2 is shown in FIG. 1 and is comprised of several steps. The base coat preferably consists of a hybrid epoxy, thermosetting powder coating or the like. However, the base coat used in this step may be comprised of an organic or inorganic chemical composition. The base coating may also be comprised of an electroplated coating, an e-coating, a 2K cured-type liquid, a UV cured-type liquid. E-coatings are generally applied in liquid form via an electroplating process whereby the substrate is either submerged in a dip tank under specified electrically charged conditions or is sprayed with the liquid e-coating material and then heated for curing purposes. E-coating is a coating method known in the art of giving a metal or other substrate an organic finish by using electrical current to deposit a coating of an epoxy, acrylic or other liquid coating. 2K cured coating is a coating method known in the art and is a two part coating consisting of a base and a hardener which are mixed prior to use. The base coatings may be organic or inorganic and nonmetallic or metallic in composition. The preferred base coating is a nonmetallic, organic hybrid epoxy thermosetting powder.

Referring to FIG. 1, the wheel is coated in the horizontal face up position to ensure even and smooth coverage. By applying the powder at the elevated temperature of approximately 150° F. to 290° F., the powder begins to melt on the wheel upon application. This process step accomplishes several advantages: it ensures that all areas are coated and that the pores of the aluminum or steel are still in an outgased stage, it enables a thinner coat to be applied, and it reduces the time to preheat the metal in the next step. The desired thickness of the base coat is approximately 1.5 to 5.0 mils. However, a thicker coating may be required depending on the surface configuration to ensure that the finish lays as flat as possible. Some thermal-setting powders require the powder to go through a flow-out stage at a temperature lower than its cure temperature level for a period of time. In that case, the wheel or object is next preheated to an approximate temperature range of 285° F. to 310° F. after which it remains in that temperature range for a period of approximately 8 to 12 minutes. During this phase step the powder continues to melt and flow evenly across all wheel surfaces. Temperature fluctuations above the desired range will cause the flow-out process to stop, while fluctuations below can cause thermal shock and effect the smoothness of the surface. Variations in time, outside the parameters will typically result in an uneven, wavy or orange peal type finishes.

The wheel temperature is next increased to a range of approximately 445° F. to 500° F., after which it remains at that temperature for a period ranging from 13 to 65 minutes. During this step the powder crosslinks and solidifies. If the temperature or time is reduced, typically evidenced by a light, transparent brown appearance, the surface will experience some movement during the curing of the top coat stage and thereby cause cracking in the Cr coating. The wheel is next cooled to a temperature range of approximately 100° F. to 250° F., in preparation for the metalization process. By keeping the wheel at an elevated temperature, the metalization layers adhere better to the organic base coat, for example, and it provides a brighter (lighter color) to the Cr coating.

Two-Step PVD Stage

The wheel is next placed into a Physical Vapor Deposition (PVD) chamber for metalization. The chamber is equipped with Ni/Cr targets and Cr targets. Sufficient targets are arranged so that one of each type target will cover 100% of the wheel as the wheel is rotated on its axes in the chamber, to ensure complete coverage. The pressure in the chamber is then reduced to a pressure of approximately 0.2 to 0.75 mTorr to evacuate any moisture, outgas chamber walls and wheel base coat, and to create a vacuum environment.

Clean Dry Air (CDA) is then injected into the chamber to increase the pressure to approximately 50 mTorr. At this time, the surface of the substrate is Plasma Cleaned using a Glow Discharge Etching process. The etching cathode is sized and placed in sufficient numbers so as to ensure complete coverage of the substrate. High voltage, generally in the 600 to 700 volt range using an RF power supply, generally between 2.0 and 5.0 kW, is applied to the cathode. This causes a generally peening and/or etching of the surface which removes any contamination and which mechanically improves the adhesion properties of the surface. The CDA also has a chemical effect on the surface and which promotes adhesion properties. The power levels and time of this step will vary depending on the chamber and configuration of the substrate. Upon completion of the Plasma Etching process, the CDA is turned off and the chamber pressure is reduced to its initial level. This removes the contamination displaced during the plasma process and ensures that the substrate and chamber are ready for the application of the metal layers.

Argon, of approximately 99.99% purity, is then injected into the chamber to bring the pressure up to approximately 2.5 to 3.5 mTorr, in order to create a plasma environment. At this step, a base metal alloy layer consisting of approximately 50 wt % to 80 wt % Ni and approximately 50 wt % to 20 wt % Cr is applied by sputtering for approximately 10 to 20 seconds at approximately 700 volt, 17 amps or 12 kW. By varying the power levels the time to apply the metal can be increased or decreased. For example, by decreasing the power level, the deposition time of the metals is reduced. The latter can be advantageous by promoting better adhesion, providing a more consistent coating thickness and increasing the percentage of the metal target that can be utilized for coating. These process step parameters are exemplary and vary depending upon the type of PVD machine and power supply utilized in the PVD machine. For example, changes in the power supply would change the time and voltage required. A lower content of Ni and a higher content of Cr in a target will produce a lighter color on the second (Cr) metalization layer. The base metal coating of this invention step provides a stable base for the Cr to be applied over. Samples without the Ni/Cr base were found to develope cracks in the final step of heating the wheel to cure the top coat.

The pressure in the chamber is then reduced to a pressure of approximately 0.25 to 3.5 mTorr, in preparation for applying the Cr metal coating. Cr of approximately 99.99% purity is then applied by sputtering for approximately 5 to 10 seconds at approximately 620 volts, 19 amps or 12 kW. These process steps are exemplary depending upon PVD machine type, power supply, size of targets and chamber pressure, etc. During the Ni/Cr application the Cr target will be charged in a range of approximately 0.25 kW to 0.5 kW, and during the Cr application the Ni/Cr target is charged in the same range to prevent contamination from each other. The desired thickness of the combined two metal layers is about 350 Å to 3000 Å with approximately 66.6% of the thickness made up of the Ni/Cr layer and approximately 33.3% made up of the Cr layer. On completion of the base and top coat the chamber is vented back to atmospheric pressure using CDA. Using the processed air to vent the chamber prevents contamination of the chamber's interior. The wheel is then removed from the vacuum chamber for application of the protective, clear organic top coat, for example. The two-step PVD stage set forth herein is exemplary and the NiCr and Cr layers may be deposited onto the prepared substrate surface in any known manner including for example, by Arc, Evaporative, CVD or similar methods of vacuum metalization. The important aspect of this stage being the use of the sequential NiCr and Cr layers onto the prepared substrate surface within a specific pressure range and coating thickness.

As known in the art, various PVD and CVD processes are known utilizing metallic targets in vacuum conditions and employing magnetrons to produce magnetic fields for concentrating the deposit of the metal ions to the object. For example, a planar magnetron configuration has been found suitable in the two-step PVD process of the present invention. Thus, a planar magnetron sputtering source or one having a flat or planar shaped target has been found suitable in accordance with the process of this invention. However, other vacuum metalization processes may also be utilized in the chroming of aluminum and steel substrates process of this invention.

By altering the pressures or adding various percentages of gases into the chamber the color of the Cr being applied may be altered. Colors such as Black Chrome, Chestnut Chrome, Blue Chrome, Purple Chrome and Gold Chrome may thus be produced. For example, by adding CDA with the Argon into the chamber during the deposition process, the gas or chamber mixture (i.e., approximately 15–55% CDA by volume) and inherent increase in pressure may produce a Black Chrome finish instead of the traditional Bright Chrome appearance. Altering the chamber conditions further by increasing the pressure will produce a darker finish. Increasing the percentage of CDA can have the effect of producing more Gold tones in the Cr. Additional effects and/or colors can be produced, for example, by using different gases (other than CDA), altering the power levels to the targets, changing the distance of the substrate from the targets or any combinations thereof. An advantage of this methodology is the ability to alter a substrate's color without having to clean the chamber or alter the metal composition of the targets between color changes. A further advantage is the elimination of the need to use pigmented clear coats which require timely line changes and costly down time to a production line.

Topcoat Application Stage

The Topcoat Application Stage 4 is shown in FIG. 1. The clear organic top coat application preferably consists of an acrylic, thermosetting powder coating or the like. The purpose of the topcoat is to provide protection to the metal coatings, wear resistance and UV protection. The topcoat may have an organic or inorganic chemical composition. The top coating may also be comprised of but not limited to an electroplated coating, an e-coating, a 2K cured-type liquid, or a UV cured-type liquid. The e-coating provides a scratch resistant top coat for the chrome layer applied in the two-step PVD process of the invention. E-coatings are generally applied in liquid form via an electroplating process whereby the chromed substrate is either submerged in a dip tank under specified electrically charged conditions or is sprayed with the liquid e-coating material and then heated for curing purposes. The top coatings may be organic or inorganic and nonmetallic or metallic in composition. The preferred topcoat is a nonmetallic, organic acrylic thermosetting powder.

The wheel is coated in the horizontal face up position to ensure even and smooth coverage. The desired thickness of the coating is in a range of approximately 2.0 to 3.0 mils. The clear top coat is applied at a temperature range between approximately 65° F. to 200° F. Temperatures exceeding these parameters will cause the Cr layer to darken. After application of the clear top coat, the wheel is preheated to an approximate temperature range of 320° F. to 360° F., after which it will remain at that temperature for a period of approximately 15 to 20 minutes. During this method step, the powder will crosslink and solidify. The wheel then enters a cool down chamber where filtered air cools the wheels to ambient temperature.

Figure 2:
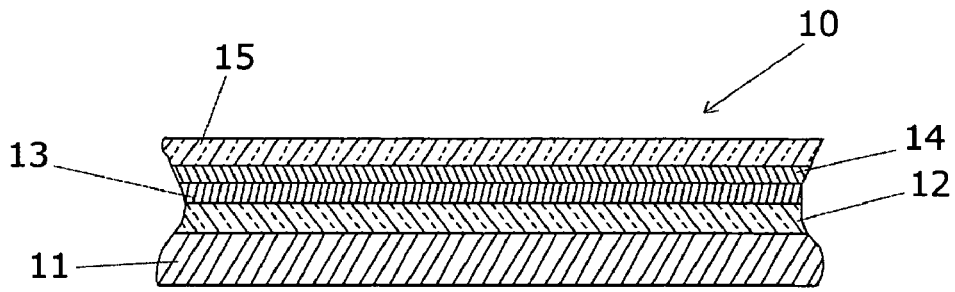
FIG. 2 is a cross-sectional view of a substrate showing the layers formed thereon from the process of the present invention.

FIG. 2 shows a cross-section of the layers formed on the chromed substrate 10 as a result of the process steps of the present invention. The wheel or substrate 11 is shown to have a base coat layer 12, a Ni/Cr metal layer 13, a Cr layer 14, and a top coat layer 15. The base coat 12 is preferably a hybrid epoxy, thermosetting powder or the like. The Ni/Cr layer 13 and the Cr layer 14 are formed in the two-step PVD process and are, together, preferably in a thickness range of approximately 350 Å to 3000 Å. The top coat is preferably an acrylic, thermosetting powder coating or the like, however other top coat compositions may be utilized as previously discussed.

The discussion above regarding the base coat application stage and the top coat application stage, particularly with respect to FIG. 1, relates respectively to the application of a hybrid epoxy, thermosetting powder coating for the base coat and the application of an acrylic thermosetting powder coating for the top coat. The application of these base coat and top coat formulations require specific process parameters, i.e., temperatures, times, etc., as discussed with respect to FIG. 1. As also discussed herein, other base coat and top coat formulations may also be used in the metalization process of the invention. The application parameters of these base coat and top coat formulations may be different from those discussed with respect to FIG. 1 and are generally set by the manufacturers of the coating formulations.

Although a clear top coat has been discussed in the process of the invention, various colored tints may also be utilized on the chromed layer produced in this invention. For example, the top coat itself may be tinted with a color, or a color may be provided to the object itself during the PVD process. For example, the introduction of a gas such as Argon, Nitrogen, or the like in the PVD process, as known in the art and discussed above, will produce a specified color to the object.

Extensive testing has been conducted on the environmental durability of the coating layers formed by the processes of this invention. Testing requirements as set forth by the major OEM Automotive manufacturers for painted aluminum and steel wheels have been conducted and passed on products having the coatings of the present invention. A majority of these tests required a scribe mark which passed completely through the applied finish and thereby exposing the substrate to the imposed environment of the test.

In summary, the process of the present invention provides a Preparation Stage 1, a Base Coat Application Stage 2, a Two-Step PVD Stage 3, and a Top Coat Application Stage 4. The process forms metallic layers or produces a chrome coating on a surface such as vehicle wheels, hub caps, bumpers and the like, on which it is desirable to have a decorative chrome finish. The process of this invention is conducted without the use of hazardous chemicals, making it environmentally friendly, and produces a chrome finish which is resistant to the elements and has a reduced potential for delamination.

As many changes are possible to the embodiments of the processes and coating compositions of this invention utilizing the teachings thereof, the descriptions above, and the accompanying drawing should be interpreted in the illustrative and not in the limited sense.

What is claimed is:

1. A coating composition for a prepared aluminum or steel substrate comprising:
   a) a base coating, said base coating being a hybrid epoxy thermosetting powder coating;
   b) a first stabilizing metallic layer applied to said base coating via a physical vapor deposition process, said first stabilizing metallic layer comprising a mixture of approximately 80 wt % Nickel and 20 wt % Chromium;
   c) a second metallic layer applied to said first stabilizing metallic layer via a physical vapor deposition process, said second metallic layer comprising at least approximately 99.9% pure Chromium; and
   d) a top protective layer applied to said second metallic layer, said top protective layer being an acrylic thermosetting powder coating.

2. The coating composition of claim 1, wherein said top protective layer is cured at an approximate range of 320–360° F.

3. The coating composition of claim 1, wherein said coating composition has a color and wherein said color is provided in said second metallic layer.

4. A coating composition for an aluminum substrate comprising:
   a) an organic base coating;
   b) a first metallic layer, said first metallic layer comprising a mixture of approximately 50–80 wt % Nickel and approximately 50–20 wt % Chromium;
   c) a second metallic layer applied to said first metallic layer, said second metallic layer comprising at least approximately 99.9% pure Chromium; and
   d) an organic top protective coating applied to said second metallic layer.

5. The coating composition of claim 4, wherein said top protective coating is selected from the group of protective coatings consisting of acrylic thermosetting powder coatings and e-coatings.

6. The coating composition of claim 4, wherein said base coating is selected from the group of base coatings consisting of hybrid epoxy thermosetting powder coatings, e-coatings and combinations thereof.

7. The coating composition of claim 4, wherein said first metallic layer and said second metallic layer are applied via a vapor deposition process.

8. The coating composition of claim 4, wherein said coating composition has a color and wherein said color is provided in said second metallic layer.

9. A coating composition for a substrate comprising:
   a) a base layer, said base layer being an organic coating selected from the group of organic coatings consisting of hybrid epoxy thermosetting powder coatings and liquid e-coatings;
   b) a first metallic layer applied on said base layer, said first metallic layer comprising a mixture of approximately 70–80 wt % Nickel and approximately 30–20 wt % Chromium;
   c) a second metallic layer applied to said first metallic layer, said second metallic layer comprising at least approximately 99.9% pure Chromium; and
   d) a top layer applied to said second metallic layer, said top layer being selected from the group of organic layers consisting of acrylic thermosetting powder coatings and e-coatings.

10. The coating composition of claim 9, wherein said first metallic layer comprises a mixture of approximately 80 wt % Nickel and 20 wt % Chromium.

11. The coating composition of claim 9, wherein said first metallic layer and said second metallic layer are applied via a physical vapor deposition process and wherein said top layer is selected from the group of layers consisting of acrylic thermosetting powder coatings coatings and e-coatings and wherein said base layer is selected from the group of base layers consisting of hybrid epoxy thermosetting powder coatings, e-coatings and combinations thereof.

12. The coating composition of claim 9, wherein said top layer is an acrylic thermosetting powder coating and wherein said base layer is a hybrid epoxy thermosetting powder coating.

13. The coating composition of claim 9, wherein said substrate is a metal.

14. The coating composition of claim 13, wherein the metal is aluminum or steel.

15. The coating composition of claim 9, wherein said coating composition has a color.

16. The coating composition of claim 15, wherein said color is provided in said top layer.

* * * * *